United States Patent
Okumura et al.

(10) Patent No.: US 9,006,784 B2
(45) Date of Patent: Apr. 14, 2015

(54) SEMICONDUCTOR DEVICE AND MANUFACTURING METHOD THEREOF

(71) Applicants: Tomomi Okumura, Chiryu (JP); Takuya Kadoguchi, Toyota (JP)

(72) Inventors: Tomomi Okumura, Chiryu (JP); Takuya Kadoguchi, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/206,781

(22) Filed: Mar. 12, 2014

(65) Prior Publication Data

US 2014/0264819 A1 Sep. 18, 2014

(30) Foreign Application Priority Data

Mar. 14, 2013 (JP) ................................. 2013-052117

(51) Int. Cl.
| | | |
|---|---|---|
| H01L 29/73 | (2006.01) | |
| H01L 23/34 | (2006.01) | |
| H01L 23/495 | (2006.01) | |
| H01L 21/50 | (2006.01) | |
| H01L 21/48 | (2006.01) | |
| H01L 23/367 | (2006.01) | |

(52) U.S. Cl.
CPC ... *H01L 23/3672* (2013.01); *H01L 2224/49175* (2013.01)

(58) Field of Classification Search
CPC .................. H01L 23/3672; H01L 2224/49175
USPC ........... 257/777, 182, 707, E23.051; 438/122
See application file for complete search history.

(56) References Cited

U.S. PATENT DOCUMENTS

| | | | | |
|---|---|---|---|---|
| 7,470,939 | B2 * | 12/2008 | Mochida et al. | 257/177 |
| RE41,869 | E * | 10/2010 | Kawashima et al. | 257/678 |
| 2013/0021749 | A1 | 1/2013 | Nakajima | |
| 2013/0062751 | A1 | 3/2013 | Takagi et al. | |

FOREIGN PATENT DOCUMENTS

| | | | |
|---|---|---|---|
| JP | 2007-027794 | A | 2/2007 |
| JP | 2009-164647 | A | 7/2009 |
| JP | 2011-217548 | A | 10/2011 |
| JP | 2011-233606 | A | 11/2011 |
| JP | 2012-015453 | A | 1/2012 |
| JP | 2012-235081 | A | 11/2012 |
| JP | 2013-135022 | A | 7/2013 |
| WO | 2012143784 | A2 | 10/2012 |
| WO | 2013098629 | A1 | 7/2013 |

* cited by examiner

*Primary Examiner* — Luan C Thai
(74) *Attorney, Agent, or Firm* — Gifford, Krass, Sprinkle, Anderson & Citkowski, P.C.

(57) ABSTRACT

A semiconductor device includes a link portion that connects a second heat sink to a third heat sink via a solder. The solder is arranged on a connecting surface of a base portion of the link portion, which is orthogonal to a plate thickness direction of the base portion, in a direction perpendicular to first and second surfaces. The link portion has a rib that protrudes from the base portion in a direction orthogonal to the first and second surfaces, and a thickness of a portion where the rib is provided is equal to or less than the thickness of the corresponding heat sink. The rib is provided across an entire length of a first region that is sealed by a sealing resin body and that is between the second and the third heat sinks, in an alignment direction of a first heat sink and the third heat sink.

10 Claims, 10 Drawing Sheets

SEMICONDUCTOR DEVICE AND MANUFACTURING METHOD THEREOF

INCORPORATION BY REFERENCE

The disclosure of Japanese Patent Application No. 2013-052117 filed on Mar. 14, 2013 including the specification, drawings and abstract is incorporated herein by reference in its entirety.

BACKGROUND OF THE INVENTION

1. Field of the Invention

The invention relates to a semiconductor device and a manufacturing method thereof, in which heat sinks are arranged on both sides (i.e., one on each side) of a first semiconductor element on an upper arm side and a second semiconductor element on a lower arm side, and the upper arm and the lower arm are electrically connected by a link portion provided on at least one of the heat sink on the upper arm side and the heat sink on the lower arm side.

2. Description of Related Art

Japanese Patent Application Publication No. 2012-235081 (JP 2012-235081 A) describes a related semiconductor device in which heat sinks (first to fourth thick plate portions) are arranged on both sides (i.e., one on each side) of a first semiconductor element on an upper arm side and a second semiconductor element on a lower arm side, and a link portion (a first thin plate portion) provided on the heat sink on the upper arm side (i.e., the second thick plate portion) is electrically connected to a link portion (a second thin plate portion) provided on the heat sink on the lower arm side (i.e., the third thick plate portion).

Also, Japanese Patent Application Publication No. 2007-27794 (JP 2007-27794 A) describes another related semiconductor device in which heat sinks are arranged on both sides (i.e., one on each side) of a semiconductor element, and the heat sink is cut (i.e., machined) together with a sealing resin body, and a radiating surface of the heat sinks are exposed from the sealing resin body.

The inventors intensively studied an semiconductor device having a structure in which an upper arm and a lower arm are arranged aligned and are electrically connected via a link portion, as described in JP 2012-235081 A.

The results show that the semiconductor device deforms when pressed on from both sides in the alignment direction. For example, the cutting process described above is performed using a cutting tool such as a milling cutter while the sealing resin body is being pressed from both sides in the alignment direction after the sealing resin body has been formed. Therefore, in the cutting process, the semiconductor device is pressed on from both sides in the alignment direction and deforms. As a result, the flatness of the radiating surfaces, and the parallelism of these radiating surfaces, is difficult to ensure. Also, the sealing resin body may end up remaining on the radiating surfaces, depending on the amount of deformation.

SUMMARY OF THE INVENTION

The invention thus reduces deformation with respect to pressure from both sides in an alignment direction of a semiconductor device, in a semiconductor device that is provided with at least one pair of arms, i.e., an upper arm and a lower arm.

A first aspect of the invention relates to a semiconductor device that includes a first semiconductor element that forms an upper arm and has an electrode on each of a first surface and a first back surface that is on an opposite side of the first semiconductor element from the first surface; a second semiconductor element that forms a lower arm and is arranged parallel to the first semiconductor element, and has an electrode on each of a second surface and a second back surface that is on an opposite side of the second semiconductor element from the second surface; a first heat sink that is electrically connected to the electrode on the first back surface of the first semiconductor element; a second heat sink that is electrically connected to the electrode on the first surface of the first semiconductor element; a third heat sink that is electrically connected to the electrode on the second back surface of the second semiconductor element; a fourth heat sink that is electrically connected to the electrode on the second surface of the second semiconductor element; a link portion that is provided on at least one of the second heat sink and the third heat sink, and has a base portion that is thinner than the corresponding heat sink, and that electrically connects the second heat sink to the third heat sink via a solder; and a sealing resin body that integrally seals the first semiconductor element, the second semiconductor element, the first heat sink, the second heat sink, the third heat sink, the fourth heat sink, and the link portion. The solder is arranged on a connecting surface of the base portion, which is orthogonal to a plate thickness direction of the base portion itself, in a direction perpendicular to the first surface and the second surface. A radiating surface of each of the first heat sink and the third heat sink, which is on an opposite side of the first heat sink and the third heat sink from the corresponding semiconductor element, is exposed from the sealing resin body. The link portion has a rib that protrudes from the base portion in a direction perpendicular to the first surface and the second surface; a thickness of a portion where the rib is provided is equal to or less than the thickness of the corresponding heat sink; and when a region that is sealed by the sealing resin body and that is between the second heat sink and the third heat sink in an alignment direction of the first heat sink and the third heat sink is a first region, the rib is provided across an entire length of the first region in the alignment direction.

In the invention, the rib is provided across the entire length in the alignment direction of the first region. Therefore, compared with a structure in which the rib is not provided, the rigidity of the link portion, and thus the first region, with respect to pressure from both sides in the alignment direction, is able to be improved. That is, the link portion will not deform in the direction perpendicular to the first and second surfaces as easily as the related art will. Accordingly, deformation is able to be inhibited from occurring in the first region, and thus the semiconductor device, with respect to pressure from both sides in the alignment direction.

Also, the rib is locally provided on the base portion that is thinner than the corresponding heat sink. Therefore, the link portion is able to be bent.

Further, a radiating surface of each of the second heat sink and the fourth heat sink, which is on an opposite side of the second heat sink and the fourth heat sink from the corresponding semiconductor element, may be exposed from the sealing resin body.

According to this structure, heat is able to be radiated to the outside from both sides of the semiconductor element in a direction perpendicular to the first and second surfaces. Also, when forming this kind of semiconductor device by cutting, the heat sink is cut together with the sealing resin body while the sealing resin body is being pressed on from both sides in the alignment direction. However, according to this example embodiment, the rigidity of the link portion, and thus the first region, with respect to pressure from both sides in the alignment direction is increased, so deformation in the direction perpendicular to the first and second surfaces is able to be inhibited.

A second aspect of the invention relates to a manufacturing method of a semiconductor device that includes a first semiconductor element that forms an upper arm and has an electrode on each of a first surface and a first back surface that is on an opposite side of the first semiconductor element from the first surface; a second semiconductor element that forms a lower arm and is arranged parallel to the first semiconductor element, and has an electrode on each of a second surface and a second back surface that is on an opposite side of the second semiconductor element from the second surface; a first heat sink that is electrically connected to the electrode on the first back surface of the first semiconductor element; a second heat sink that is electrically connected to the electrode on the first surface of the first semiconductor element; a third heat sink that is electrically connected to the electrode on the second back surface of the second semiconductor element; a fourth heat sink that is electrically connected to the electrode on the second surface of the second semiconductor element; a link portion that is provided on at least one of the second heat sink and the third heat sink, and has a base portion that is thinner than the corresponding heat sink, and that electrically connects the second heat sink to the third heat sink via a solder; and a sealing resin body that integrally seals the first semiconductor element, the second semiconductor element, the first heat sink, the second heat sink, the third heat sink, the fourth heat sink, and the link portion. In this semiconductor device, the solder is arranged on a connecting surface of the base portion, which is orthogonal to a plate thickness direction of the base portion itself, in a direction perpendicular to the first surface and the second surface. A radiating surface of each of the first heat sink, the second heat sink, the third heat sink and the fourth heat sink, which is on an opposite side of the first heat sink and the third heat sink from the corresponding semiconductor element, is exposed from the sealing resin body. The link portion has a rib that protrudes from the base portion in a direction perpendicular to the first surface and the second surface. A thickness of a portion where the rib is provided is equal to or less than the thickness of the corresponding heat sink. When a region sealed by the sealing resin body and in which a position in an alignment direction of the first heat sink and the third heat sink is between the second heat sink and the third heat sink is a first region, the rib is provided across an entire length in the alignment direction of the first region. This manufacturing method includes i) preparing, for at least one of a second heat sink and a third heat sink, a heat sink that has the link portion that electrically connects the second heat sink to the third heat sink via the solder, the link portion having a base portion that is thinner than the corresponding heat sink, and the rib that protrudes from the base portion in the direction perpendicular to the first surface and the second surface, and that is provided across the entire length in the alignment direction of the first region in which the position in the alignment direction of the first heat sink and the third heat sink is between the second heat sink and the third heat sink, and the thickness of the portion of the link portion where the rib is provided being equal to or less than the thickness of the corresponding heat sink; ii) electrically connecting the electrode on the first back surface of the first semiconductor element to the first heat sink, electrically connecting the electrode on the first surface of the first semiconductor element to the second heat sink, electrically connecting the electrode on the second back surface of the second semiconductor element to the third heat sink, electrically connecting the electrode on the second surface of the semiconductor element to the fourth heat sink, and electrically connecting the second heat sink to the third heat sink via the solder by the link portion; iii) forming the sealing resin body so as to integrally seal the first semiconductor element, the second semiconductor element, the first heat sink, the second heat sink, the third heat sink, the fourth heat sink, and the link portion, and such that the radiating surface of each of the heat sinks is covered; and iv) exposing the radiating surfaces of the first heat sink and the third heat sink from the sealing resin body by cutting the first heat sink and the third heat sink together with the sealing resin body, and exposing the radiating surfaces of the second heat sink and the fourth heat sink from the sealing resin body by cutting the second heat sink and the fourth heat sink together with the sealing resin body, while the sealing resin body is being pressed on from both sides in the alignment direction of the first heat sink and the third heat sink.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
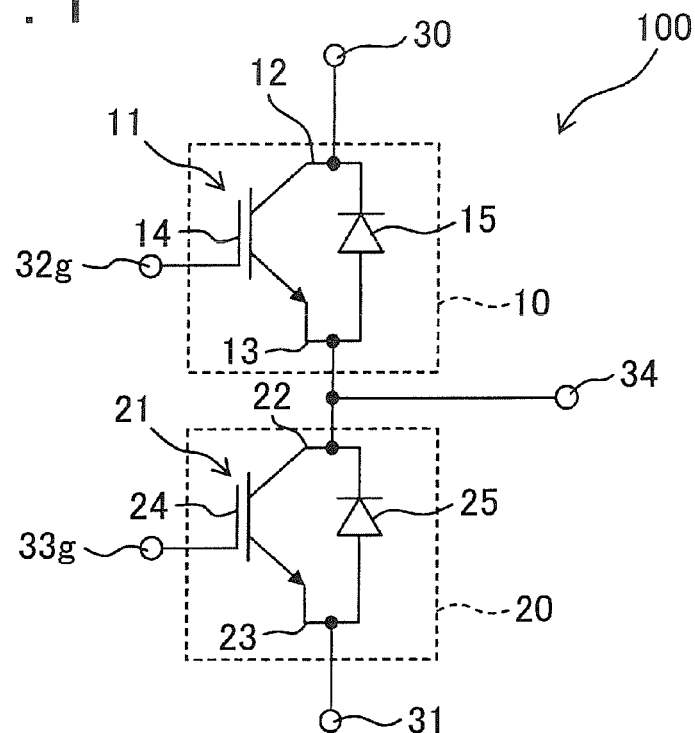
FIG. 1 is an equivalent circuit diagram of a semiconductor device according to a first example embodiment of the invention.

Hereinafter, example embodiments of the invention will be described with reference to the accompanying drawings. Like or equivalent portions in the drawings described below will be denoted by like reference characters. In the description below, a direction perpendicular to one surface of a semiconductor element, i.e., a thickness direction of the semiconductor element, will be given as the Z direction. Also, an alignment direction of a first heat sink and a third heat sink on upper and lower arms that are connected in series, which is orthogonal to the Z direction, i.e., an alignment direction of the first semiconductor element and the second semiconductor element, will be given as the X direction, and a direction that is orthogonal to both the X direction and the Z direction will be given as the Y direction. Also, a flat shape is a shape along a plane defined by the X direction and the Y direction.

FIRST EXAMPLE EMBODIMENT

First, an inverter circuit formed in a semiconductor device 100 will be described.

As shown in FIG. 1, an inverter circuit provided with a pair of arms, i.e., an upper arm circuit portion 10 and a lower arm circuit portion 20, is formed in the semiconductor device 100.

The upper arm circuit portion 10 includes an n channel-type IGBT element 11, and a return FWD element 15 that is connected in inverse-parallel to the IGBT element 11. Also, the lower arm circuit portion 20 includes an n channel-type IGBT element 21, and a return FWD element 25 that is connected in inverse-parallel to the IGBT element 21. This IGBT element 11 corresponds to a first semiconductor element described in the claims, and the IGBT element 21 corresponds to a second semiconductor element described in the claims.

The IGBT element 11 has a collector electrode 12, an emitter electrode 13, and a gate electrode 14. Similarly, the IGBT element 21 has a collector electrode 22, an emitter electrode 23, and a gate electrode 24.

The collector electrode 12 of the IGBT element 11, together with a cathode electrode of the FWD element 15, is connected to a high voltage power supply terminal 30. Meanwhile, the emitter electrode 23 of the IGBT element 21, together with anode electrode of the FWD element 25, is connected to a low voltage power supply terminal 31. A gate terminal 32g is connected to the gate electrode 14 of the IGBT element 11, and a gate terminal 33g is connected to the gate electrode 24 of the IGBT element 21. Also, the emitter electrode 13 of the IGBT element 11 and an anode electrode of the FWD element 15 are connected to the collector electrode 22 of the IGBT element 21 and a cathode electrode of the FWD element 25. An output terminal 34 is connected to this junction point.

Next, the general structure of the semiconductor device 100 will be described with reference to FIGS. 2 to 7.

The semiconductor device 100 includes the IGBT elements 11 and 21, the FWD elements 15 and 25, the high voltage power supply terminal 30, the low voltage power supply terminal 31, control terminals 32 and 33 that include the gate terminals 32g and 33g, and an output terminal 34. In addition, the semiconductor device 100 includes four heat sinks 40, 44, 50, and 54, two terminals 42 and 52, two link portions 46 and 56, and a sealing resin body 70.

The IGBT element 11 has the emitter electrode 13 and the gate electrode 14 on one surface 11a that is orthogonal to the Z direction, and has the collector electrode 12 on a back surface 11b that is on the opposite side of the IGBT element 11 from the one surface 11a.

The first heat sink 40 is arranged on the collector electrode 12 side of the IGBT element 11 in the Z direction. This first heat sink 40 is electrically and mechanically connected to the collector electrode 12 via solder 41. The cathode electrode of the FWD element 15 is also connected to a connecting surface of the first heat sink 40 that is connected to the collector electrode 12.

Figure 2:
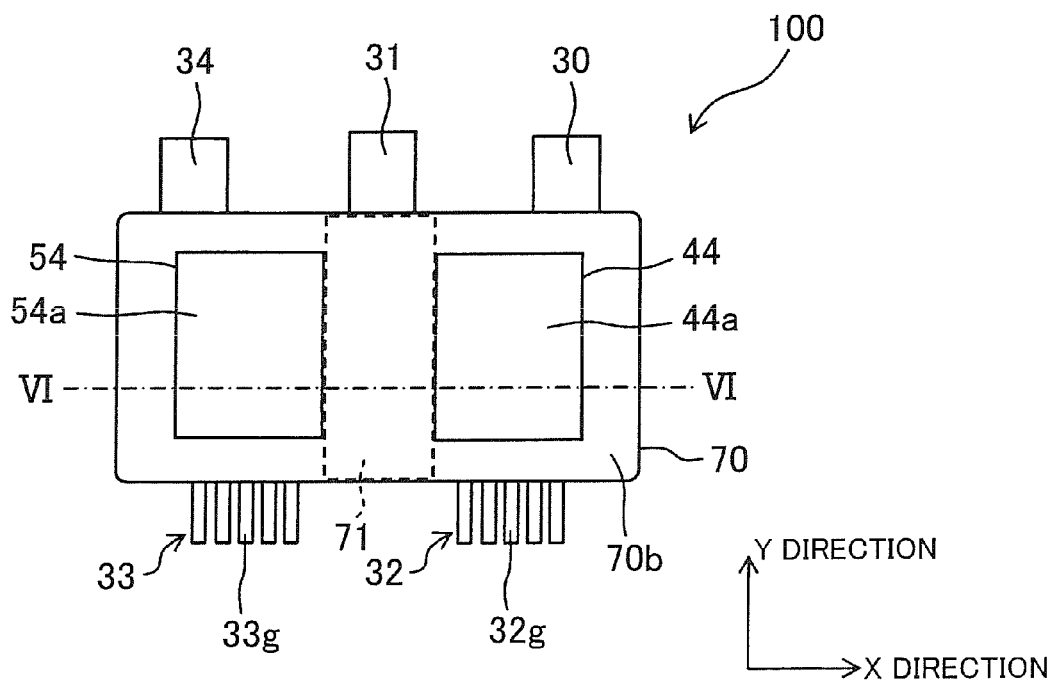
FIG. 2 is a plan view of the general structure of the semiconductor device of the invention.
Figure 3:
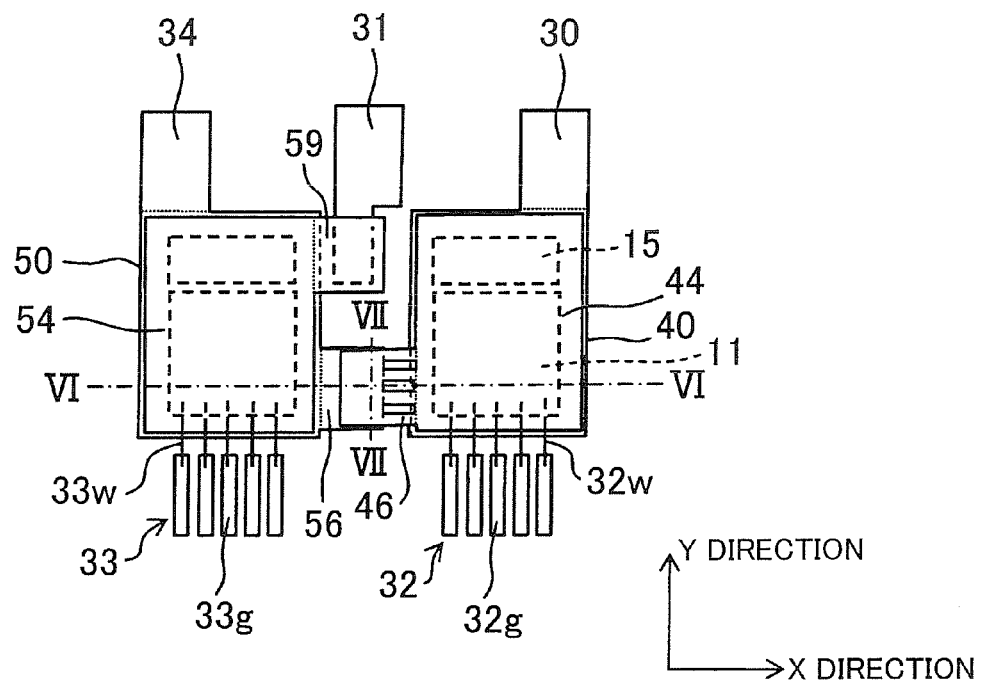
FIG. 3 is a plan view showing the positional relationship of heat sinks, a first link portion, and a second link portion.
Figure 6:
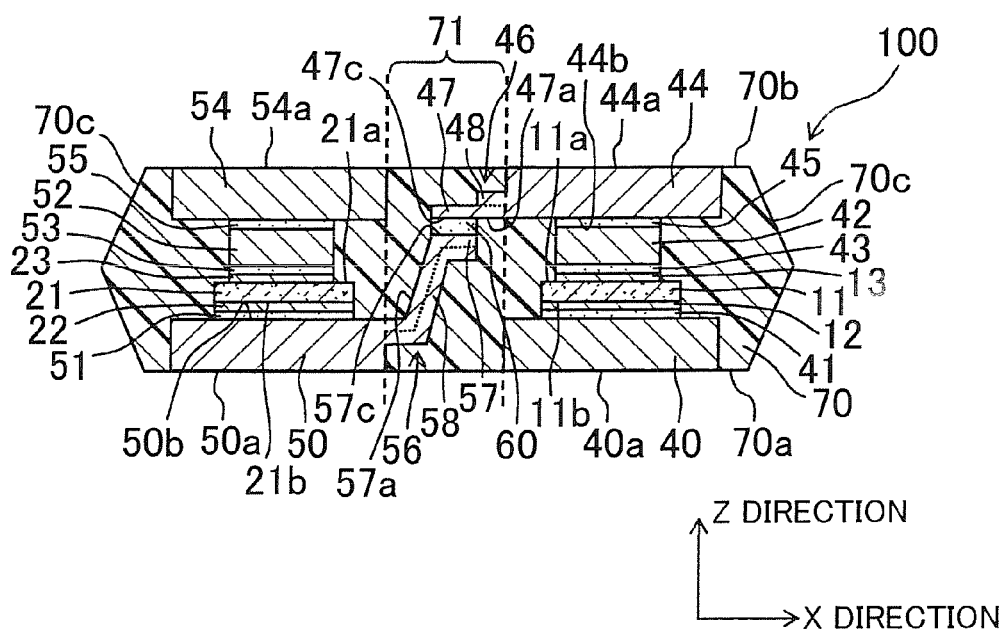
FIG. 6 is a sectional view taken along line VI-VI in FIG. 2.

The first heat sink 40 has a flat rectangular shape, as shown in FIG. 3, and the high voltage power supply terminal 30 is provided extending in the Y direction from one side of the rectangle. Also, the surface of the first heat sink 40 that is on the opposite side of the first heat sink 40 from the IGBT element 11 is exposed from a first surface 70a of the sealing resin body 70, and serves as a radiating surface 40a, as shown in FIG. 6. As a result, heat generated in the IGBT element 11 and the FWD element 15 is able to be radiated to the outside from the radiating surface 40a of the first heat sink 40. Also, the high voltage power supply terminal 30 is able to be electrically connected to the IGBT element 11 and the FWD element 15 via the first heat sink 40. A portion of the high voltage power supply terminal 30 protrudes outward from a side surface 70c of the sealing resin body 70, as shown in FIG. 2.

The first terminal 42 is arranged opposing the emitter electrode 13, without overlapping with the gate electrode 14, on the emitter electrode 13 side of the IGBT element 11, and the first terminal 42 is electrically and mechanically connected to the emitter electrode 13 via solder 43. An anode electrode of the FWD element 15 is also connected to a connecting surface of the first terminal 42 that is connected to the emitter electrode 13. This first terminal 42 has a transfer function for electrically connecting the IGBT element 11 and the FWD element 15 to the second heat sink 44, as well as a function to ensure the height for wire bonding to the gate electrode 14. In this example embodiment, the first terminal 42 has a flat rectangular shape so as to overlap with the emitter electrode 13 and the FWD element 15 of the IGBT element 11.

The gate electrode 14 is connected to the gate terminal 32g, of the control terminals 32, via a bonding wire 32w. As shown in FIG. 3, in this example embodiment, there are a total of five control terminals 32, i.e., two for temperature measuring diodes, one gate terminal 32g, one for current sense, and one for emitter sense. These control terminals 32 are arranged such that the IGBT element 11 are sandwiched between the control terminals 32 and the high voltage power supply terminal 30 in the Y direction. As shown in FIG. 2, the control terminals 32 protrude toward to the outside from the side surface 70c on the opposite side of the sealing resin body 70 from the high voltage power supply terminal 30.

The second heat sink 44 is arranged on the surface side of the first terminal 42, which is on the opposite side of the first terminal 42 from the IGBT element 11. The second heat sink 44 is electrically and mechanically connected to the first terminal 42 via solder 45. That is, the second heat sink 44 is electrically connected to the emitter electrode 13 of the IGBT element 11 and the anode electrode of the FWD element 15.

The second heat sink 44 is arranged such that the majority overlaps with the first heat sink 40. In this example embodiment, the second heat sink 44 has a flat rectangular shape that is generally the same as that of the first heat sink 40, as shown in FIG. 3. Also, the second heat sink 44 has substantially the same thickness as that of the first heat sink 40. Also, a first link portion 46 is integrally connected to the second heat sink 44. This first link portion 46 will be described in detail later. Also, a surface of the second heat sink 44 that is on the opposite side of the second heat sink 44 from the IGBT element 11 is exposed from a second surface 70b of the sealing resin body 70 that is on the opposite side of the sealing resin body 70 from the first surface 70a, and serves as a radiating surface 44a. As a result, heat generated in the IGBT element 11 and the FWD element 15 is able to be radiated to the outside from the radiating surface 44a of the second heat sink 44 via the first terminal 42.

Meanwhile, the IGBT element 21 has the emitter electrode 23 and the gate electrode 24 on one surface 21a that is orthogonal to the Z direction, and has the collector electrode 22 on a back surface 21b that is on the opposite side of the IGBT element 21 from the one surface 21a.

The third heat sink 50 is arranged on the collector electrode 22 side of the IGBT element 21 in the Z direction. This third heat sink 50 is electrically and mechanically connected to the collector electrode 22 via solder 51. The cathode electrode of the FWD element 25 is also connected to a connecting surface of the third heat sink 50 that is connected to the collector electrode 22.

The third heat sink 50 has a flat rectangular shape that is generally the same as that of the first heat sink 40, as shown in FIG. 3, and has substantially the same thickness as the first heat sink 40. Also, the output terminal 34 is provided extending in the Y direction, similar to the high voltage power supply terminal 30, from one side of the rectangle. A portion of the output terminal 34 protrudes toward the outside from the side surface 70c, similar to the high voltage power supply terminal 30, of the sealing resin body 70, as shown in FIG. 2. Also, a second link portion 56 is integrally formed on the third heat sink 50. This second link portion 56 will be described in detail later.

Also, the surface of the first heat sink 40 that is on the opposite side of the first heat sink 40 from the IGBT element 11 is exposed from a first surface 70a of the sealing resin body 70, and serves as a radiating surface 40a, as shown in FIG. 6. As a result, heat generated in the IGBT element 11 and the FWD element 15 is able to be radiated to the outside from the radiating surface 40a of the first heat sink 40. Also, the high voltage power supply terminal 30 is able to be electrically connected to the IGBT element 11 and the FWD element 15 via the first heat sink 40. A portion of the high voltage power supply terminal 30 protrudes outward from a side surface 70c of the sealing resin body 70, as shown in FIG. 2.

The second terminal 52 is arranged opposing the emitter electrode 23, without overlapping with the gate electrode 24, on the emitter electrode 23 side of the IGBT element 21, and the second terminal 52 is electrically and mechanically connected to the emitter electrode 23 via solder 53. An anode electrode of the FWD element 25 is also connected to a connecting surface of the second terminal 52 that is connected to the emitter electrode 23. This second terminal 52 has a transfer function for electrically connecting the IGBT element 21 and the FWD element 25 to the fourth heat sink 54, as well as a function to ensure the height for wire bonding to the gate electrode 24. In this example embodiment, the second terminal 52 has a flat rectangular shape similar to the first terminal 42, so as to overlap with the emitter electrode 23 and the FWD element 25 of the IGBT element 21.

The gate electrode 24 is connected to the gate terminal 33g, of the control terminals 33, via a bonding wire 33w. As shown in FIG. 3, in this example embodiment, there are a total of five control terminals 33, i.e., two for temperature measuring diodes, one gate terminal 33g, one for current sense, and one for emitter sense. These control terminals 33 are arranged such that the IGBT element 21 is sandwiched between the control terminals 33, and the output terminal 34 and the low voltage power supply terminal 31 in the Y direction. As shown in FIG. 2, the control terminals 33 protrude toward to the outside from the side surface 70c on the opposite side of the sealing resin body 70 from the output terminal 34 and the low voltage power supply terminal 31.

The fourth heat sink 54 is arranged on the surface side of the second terminal 52, which is on the opposite side of the first terminal 42 from the IGBT element 21. The fourth heat sink 54 is electrically and mechanically connected to the second terminal 52 via solder 55. That is, the fourth heat sink 54 is electrically connected to the emitter electrode 23 of the IGBT element 21 and the anode electrode of the FWD element 25.

The fourth heat sink 54 is arranged such that the majority overlaps with the third heat sink 50. In this example embodiment, the fourth heat sink 54 has a flat rectangular shape that is generally the same as that of the third heat sink 50, as shown in FIG. 3. Also, the fourth heat sink 54 has substantially the same thickness as that of the second heat sink 44. A third link portion 59 is provided extending from a side surface of the fourth heat sink 54. This third link portion 59 is provided extending in the X direction from the side that is on the second heat sink 44 side in the X direction, of the four sides of the flat rectangle of the fourth heat sink 54. Also, the third link portion 59 is bent with respect to the fourth heat sink 54, and extends toward the low voltage power supply terminal 31. This third link portion 59 is provided offset in the Y direction with respect to the second link portion 56, so as not to overlap with the second link portion 56.

The low voltage power supply terminal 31 is positioned within the same plane in the Z direction, as the high voltage power supply terminal 30 and the output terminal 34. Also, the third link portion 59 is electrically connected to the low voltage power supply terminal 31 via solder, not shown.

Also, the surface of the fourth heat sink 54 that is on the opposite side of the fourth heat sink 54 from the IGBT element 21 is exposed from the second surface 70b of the sealing resin body 70, and serves as a radiating surface 54a. As a result, heat generated in the IGBT element 21 and the FWD element 25 is able to be radiated to the outside from the radiating surface 54a of the fourth heat sink 54 via the second terminal 52.

The sealing resin body 70 integrally seals the IGBT elements 11 and 21, the FWD elements 15 and 25, a portion of the high voltage power supply terminal 30, a portion of the low voltage power supply terminal 31, a portion of the control terminals 32 and 33, a portion of the output terminal 34, a portion of each of the heat sinks 40, 44, 50, and 54 excluding the radiating surfaces 40a, 44a, 50a, and 54a, the terminals 42 and 52, and the link portions 46 and 56. In this example embodiment, as shown in FIG. 2, the high voltage power supply terminal 30, the low voltage power supply terminal 31, and the output terminal 34, which are main terminals, each have a flat rectangular shape and protrude out from one side surface 70c that is substantially parallel with the X direction. Also, the control terminals 32 and 33 protrude out from the other of side surface that is substantially parallel with the X direction.

The first heat sink 40 and the third heat sink 50 are cut (i.e., machined) together with the sealing resin body 70, and the radiating surfaces 40a and 50a of these are in the same plane and are flush with the first surface 70a of the sealing resin body 70. The second heat sink 44 and the fourth heat sink 54 are also cut (i.e., machined) together with the sealing resin body 70, and the radiating surfaces 40a and 50a of these are positioned in the same plane and are flush with the second surface 70b of the sealing resin body 70.

In this way, at the portion that forms the upper arm circuit portion 10, the arrangement in the Z direction is, from the first surface 70a side, the first heat sink 40, the solder 41, the collector electrode 12, the IGBT element 11, the emitter electrode 13, the solder 43, the first terminal 42, the solder 45, and the second heat sink 44, in this order. Meanwhile, at the portion that forms the lower arm circuit portion 20, the arrangement in the Z direction is, from the first surface 70a side, the third heat sink 50, the solder 51, the collector electrode 22, the IGBT element 21, the emitter electrode 23, the solder 53, the second terminal 52, the solder 55, and the fourth heat sink 54, in this order. That is, the alignment in the Z direction is the same for both the upper arm circuit portion 10 and the lower arm circuit portion 20.

Next, the first link portion 46 and the second link portion 56 that are characteristic portions of the semiconductor device 100 will be described.

When connected together, the first link portion 46 and the second link portion 56 electrically connect the second heat sink 44 and the third heat sink 50, which are in different positions in the Z direction, together. Also, the first link portion 46 and second link portion 56 also mechanically connect the upper arm circuit portion 10 and the lower arm circuit portion 20, which are arranged aligned in the X direction, together.

The first link portion 46 and the second link portion 56 are within the arrangement region of the sealing resin body 70, i.e., within a region sealed by the sealing resin body 70, and the positions thereof in the X direction are arranged in a first region 71 between the second heat sink 44 and the third heat sink 50. In this example embodiment, the first link portion 46 and the second link portion 56 are arranged in regions opposing the second heat sink 44 and the third heat sink 50 in the Y direction, and between the first surface 70a and the second surface 70b of the sealing resin body 70 in the Z direction, i.e., between the radiating surfaces 44a and 50a, as shown in FIGS. 3 and 6.

Figure 4A:
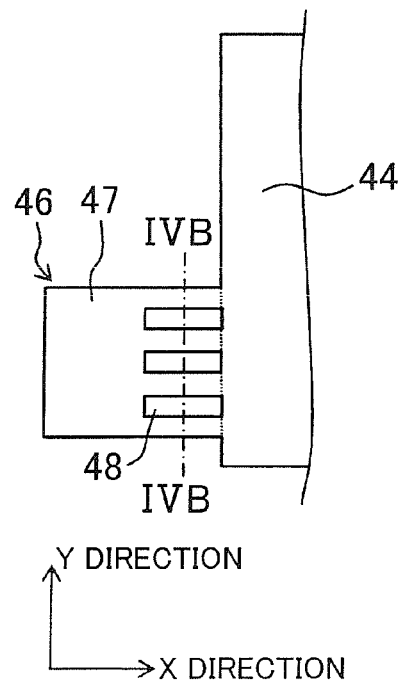
FIG. 4A is an enlarged plan view of the area around the first link portion.
Figure 4B:
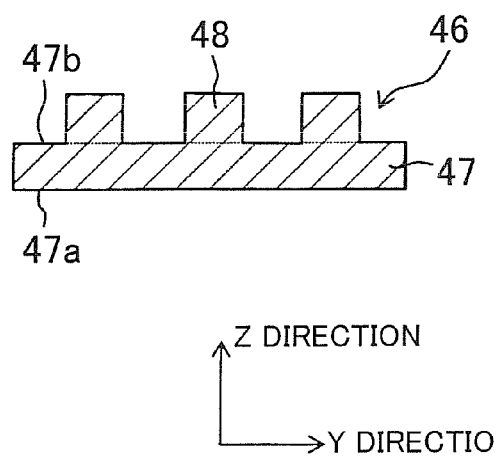
FIG. 4B is a sectional view taken along line IVB-IVB in FIG. 4A.

The first link portion 46 is integrally provided with the second heat sink 44. This first link portion 46 has a first base portion 47 that is thinner than the second heat sink 44, and a first rib 48 that protrudes from the first base portion 47, as shown in FIGS. 4A and 4B. Of surfaces that are orthogonal to the plate thickness direction of the first base portion 47 itself, the first base portion 47 has an inside surface 47a positioned on the inside of the sealing resin body 70 near the boundary with the second heat sink 44, and an outside surface 47b that is a surface on the opposite side of the first base portion 47 from the inside surface 47a, and is positioned on the second surface 70b side. The first rib 48 is provided on at least one of the inside surface 47a and the outside surface 47b of the first base portion 47. Also, the thickness of the first link portion 46 at the portion where the first rib 48 is provided, i.e., the sum of the first base portion 47 and the first rib 48, is equal to or less than the thickness of the second heat sink 44. This kind of first link portion 46 may be formed through a rolling process, for example.

Figure 5A:
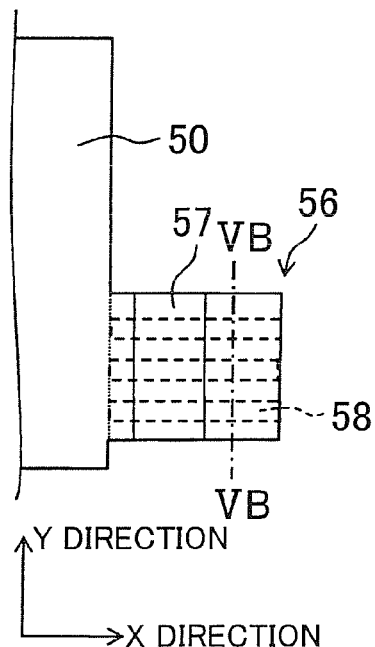
FIG. 5A is an enlarged plan view of the area around the second link portion.
Figure 5B:
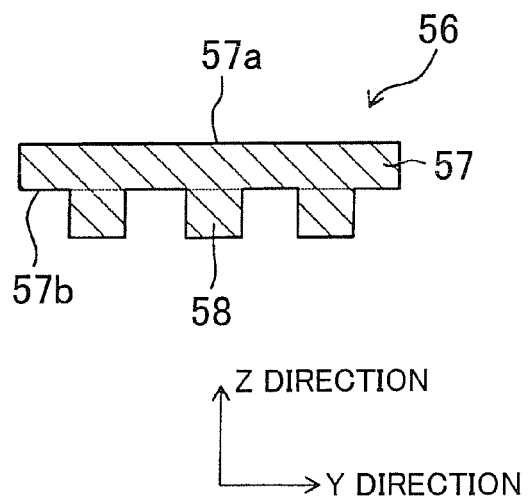
FIG. 5B is a sectional view taken along line VB-VB in FIG. 5A.

Meanwhile, the second link portion 56 is integrally provided with the third heat sink 50. This second link portion 56 has a second base portion 57 that is thinner than the third heat sink 50, and a second rib 58 that protrudes from the second base portion 57, as shown in FIGS. 5A and 5B. The second base portion 57 has an inside surface 57a positioned on the inside of the sealing resin body 70 near the boundary with the third heat sink 50, and an outside surface 57b that is a surface on the opposite side of the second base portion 57 from the inside surface 57a, and is positioned on the first surface 70a side. The second rib 58 is provided on at least one of the inside surface 57a and the outside surface 57b of the second base portion 57. Also, the thickness of the second link portion 56 at the portion where the second rib 58 is provided, i.e., the sum of the second base portion 57 and the second rib 58, is equal to or less than the thickness of the third heat sink 50. This kind of second link portion 56 may be formed through a rolling process, for example.

A portion of the inside surface 47a of the first base portion 47 and a portion of the inside surface 57a of the second base portion 57 are arranged opposing one another. These opposing portions are connecting surfaces 47c and 57c that are connected via solder 60. The first connecting surface 47c of the first base portion 47 are the second connecting surface 57c of the second base portion 57 are connected together via the solder 60 in the Z direction. Also, at least one of the first rib 48 and the second rib 58 is arranged along the entire length in the X direction of the first region 71.

In this example embodiment, the first link portion 46 is provided extending along the X direction from the side on the fourth heat sink 54 side in the X direction, of the four sides of the second heat sink 44 that has a flat rectangular shape, as shown in FIG. 3. Also, the first link portion 46 is not bent with respect to the second heat sink 44, and the first base portion 47 has a flat rectangular flat plate shape, with the inside surface 47a being flush with an inside surface 44b that is an opposing surface of the second heat sink 44 that opposes the first terminal 42. That is, the inside surface 47a is continuously connected in a stepless manner to the inside surface 44b. Therefore, the first connecting surface 47c is in the same position in the Z direction as the inside surface 44b, and is substantially perpendicular to the Z direction.

The first rib 48 is provided on the outside surface 47b of the first base portion 47, as shown in FIGS. 4B and 6. The thickness of the first link portion 46 at the portion where the first rib 48 is provided is thinner than the thickness of the second heat sink 44. In this way, the first link portion 46 is thinner than the second heat sink 44. Also, the first rib 48 is provided extending along the X direction from the boundary between the second heat sink 44 and the first base portion 47, as shown in FIG. 4A. An end portion of the first rib 48 on the opposite side of the first rib 48 from the second heat sink 44 is aligned with an end portion on the second heat sink 44 side of a region (an overlapping region) where the first connecting surface 47c and the second connecting surface 57c overlap, as shown in FIG. 6. Also, the first rib 48 is such that a sectional shape along a plane defined by the Y direction and the Z direction is a rectangular shape, and three of the first ribs 48 of the same shape are provided a predetermined distance apart from one another in the Y direction, as shown in FIG. 4B.

Meanwhile, the second link portion 56 is provided extending along the X direction from a portion corresponding to the first link portion 46, of the side on the first heat sink 40 side in the X direction, of the four sides of the third heat sink 50 that has a flat rectangular shape, as shown in FIG. 3. Also, the second link portion 56 is bent with respect to the third heat sink 50, and is provided extending toward the second heat sink 44 in the X direction. More specifically, the second link portion 56 has a bent portion in two locations, and is generally crank-shaped on a plane defined by the X direction and the Y direction. The thickness of the second base portion 57 is substantially even. The second base portion 57 has a bent portion in two locations, and is generally crank-shaped on a plane defined by the X direction and the Y direction. Also, the second connecting surface 57c is substantially perpendicular to the Z direction. Also, the inside surface 57a of the second base portion 57 is continuously connected in a stepless manner to an inside surface 50b that is a surface of the third heat sink 50 that opposes the IGBT element 21.

The second rib 58 is provided on the outside surface 57b of the second base portion 57, as shown in FIGS. 5B and 6. The thickness of the second link portion 56 at the portion where the second rib 58 is provided is thinner than the thickness of the third heat sink 50. In this way, the second link portion 56 is thinner than the third heat sink 50. Also, the second rib 58 is provided extending along the X direction from the boundary between the third heat sink 50 and the second base portion 57, to a tip end of the second base portion 57 in the X direction, as shown by the broken line in FIG. 5A. Therefore, the second rib 58 is also provided on a back surface portion of the second connecting surface 57c of the outside surface 57b. Also, the second rib 58 is such that a sectional shape along a plane defined by the Y direction and the Z direction is a rectangular shape, and three of the second ribs 58 of the same shape are provided a predetermined distance apart from one another in the Y direction, as shown in FIG. 5B.

Figure 7:
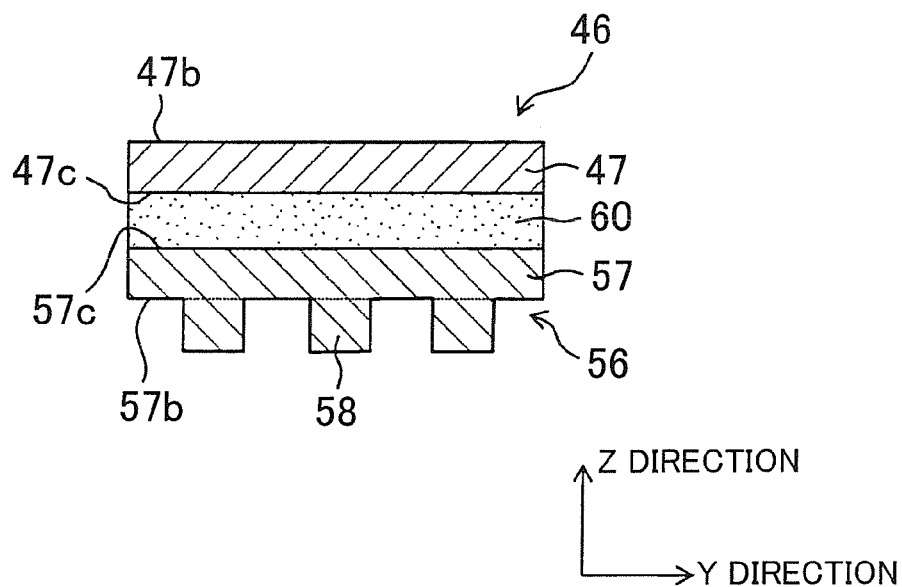
FIG. 7 is a sectional view taken along line VII-VII in FIG. 3.

In this way, in this example embodiment, the first rib 48 and the second rib 58 are arranged in a seamless manner along the entire length in the X direction of the first region 71. Also, an end portion of the first rib 48 on the opposite side of the first rib 48 from the second heat sink 44 is aligned in the X direction with an end portion of the second rib 58 on the opposite side of the second rib 58 from the third heat sink 50. As shown in FIG. 7, only the second rib 58 is provided on the connecting portion where the first connecting surface 47c is connected to the second connecting surface 57c via the solder 60.

Next, an example of a manufacturing method of the semiconductor device 100 described above will be briefly described.

First, a preparation process is performed in which the IGBT elements 11 and 21, the FWD elements 15 and 25, the heat sinks 40, 44, 50, and 54, and the terminals 42 and 52 are prepared. In this example embodiment, the second heat sink 44 integrally provided with the first link portion 46 having the first rib 48 is prepared. Also, the third heat sink 50 integrally provided with the second link portion 56 having the second rib 58 is prepared.

Figure 8:
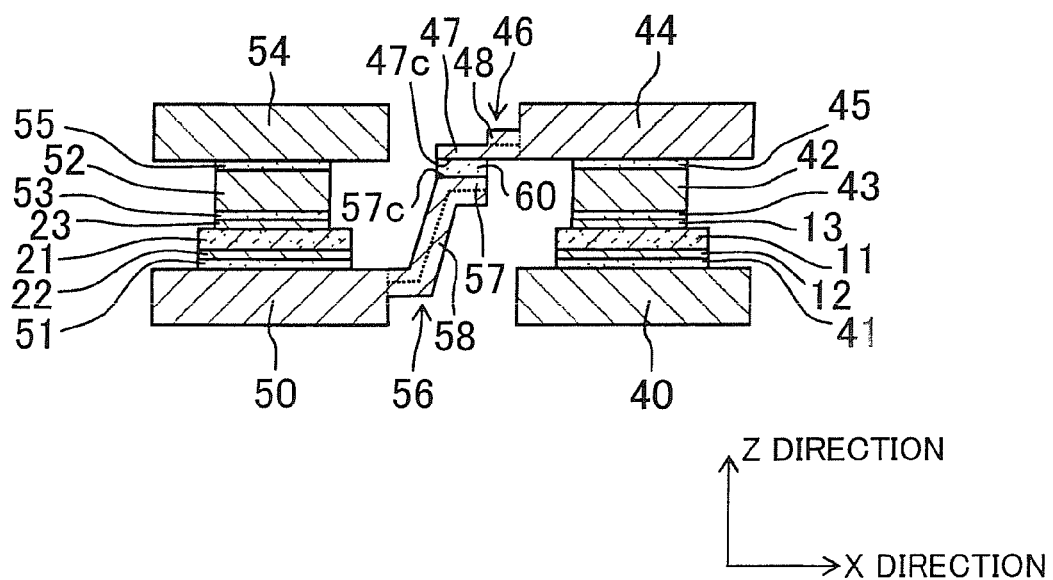
FIG. 8 is a sectional view illustrating a manufacturing method of a semiconductor device.

Next, as shown in FIG. 8, a preprocess up until the forming of the sealing resin body 70 is performed. This process is a connecting process in which the elements that form the upper arm circuit portion 10 are electrically connected, the elements that form the lower arm circuit portion 20 are electrically connected, and the first link portion 46 and the second link portion 56 that connect the upper arm circuit portion 10 and the lower arm circuit portion together are electrically connected. For this process, the process described in JP 2012-235081 A may be employed, so a description thereof will be omitted.

Next, although not shown, a molding process is performed in which the sealing resin body 70 is formed by arranging a structure formed by the manufacturing process in FIG. 8 in a mold, and injecting resin into the cavity of the mold. In this example embodiment, the sealing resin body 70 is formed by a transfer molding method using epoxy resin. At this time, the sealing resin body 70 is formed such that the radiating surfaces 40a, 44a, 50a, and 54a of the heat sinks 40, 44, 50, and 54 are covered.

Figure 9:
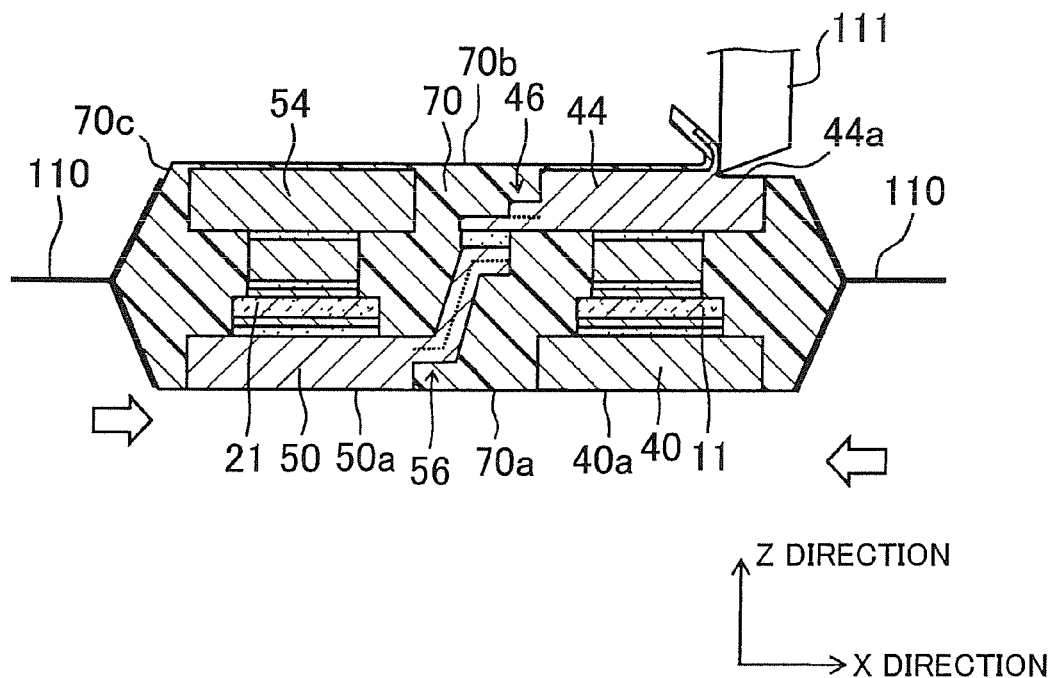
FIG. 9 is another sectional view illustrating the manufacturing method of the semiconductor device.

Next, a cutting process shown in FIG. 9 is performed.

In this cutting process, the sealing resin body 70 is pressed on in the direction indicated by the white arrow from both sides in the X direction by a presser jig 110, while the side surfaces 70c of the sealing resin body 70 are held with vacuum chucks. Then, in this state, the first heat sink 40 and the third heat sink 50, together with the sealing resin body 70, are cut from the first surface 70a side of the sealing resin body 70 with a cutting tool 111. Also, the second heat sink 44 and the fourth heat sink 54, together with the sealing resin body 70, are cut from the second surface 70b side of the sealing resin body 70 with the cutting tool 111. FIG. 9 is a view of the cut on the second surface 70b side.

This cutting exposes the radiating surfaces 40a, 44a, 50a, and 54a of the heat sinks 40, 44, 50, and 54 from the sealing resin body 70. Also, in this example embodiment, the radiating surfaces 40a and the 50a of the first heat sink 40 and the third heat sink 50 are flush with the surrounding first surface 70a, and the radiating surfaces 44a and 54a of the second heat sink 44 and the fourth heat sink 54 are flush with the surrounding second surface 70b.

The semiconductor device 100 can be obtained by cutting a tie bar, not shown, that connects the heat sinks together, for example.

Next, the operation and effects of the characteristic portions of the semiconductor device 100 will be described.

Conventionally, in a structure in which the first connecting surface 47c and the second connecting surface 57c are connected via the solder 60 in the Z direction, and the radiating surfaces 40a, 44a, 50a, and 54a are exposed from the sealing resin body 70 by cutting, the flatness of the radiating surfaces 40a, 44a, 50a, and 54a, and the parallelism of the radiating surfaces was difficult to ensure. Through intensive study, the inventors the have concluded that this problem occurs in the following manner.

As shown in FIG. 9, in the cutting process, the direction in which the sealing resin body 70 is held down (retained) (i.e., the X direction) is orthogonal to the plate thickness direction of the first link portion 46 of the first connecting surface 47c and the plate thickness direction of the second link portion 56 of the second connecting surface 57c. Therefore, when the sealing resin body 70 is held down, axial force (compression force) acts on the structures of the first link portion 46 and the second link portion 56 that are connected via the solder 60 (hereinafter, these structures will simply be referred to as the "structure"), so the structure tends to deform in the Z direction, i.e., the plate thickness direction). Conventionally, in view of bendability and the like, the first link portion 46 only has the first base portion 47 and the second link portion 56 only has the second base portion 57. Therefore, when the rigidity of the structure is low in the direction in which the sealing resin body 70 is held down, and the sealing resin body 70 is held down, the structure will deform in the Z direction. The sealing resin body 70 formed by material that has a lower Young's modulus than the structure and is present around the structure in the first region 71 will follow the deformation (curve) of the structure. That is, the first region 71 will deform in the Z direction.

Meanwhile, a portion of the upper arm circuit portion 10 that is adjacent to the first region 71 in the X direction forms a structure in which the IGBT element 11 is sandwiched between the heat sinks 40 and 44, and is thus more rigid than the first region 71. Also, a portion of the lower arm circuit portion 20 that is adjacent to the first region 71 also forms a structure in which the IGBT element 21 is sandwiched between the heat sinks 50 and 54, and is thus more rigid than the first region 71. Therefore, even if the sealing resin body 70 is held down in the cutting process, the portion of the upper arm circuit portion 10 and the portion of the lower arm circuit portion 20 will not easily deform.

However, because the structure described above, i.e., the first region 71, deforms in the Z direction, the portion of the upper arm circuit portion 10 and the portion of the lower arm circuit portion 20 become inclined, such that the entire semiconductor device 100 deforms in a convex shape in the direction above the paper on which FIG. 9 is drawn, for example. Because cutting is performed while the deformation is occurring in this way, the flatness of the radiating surfaces 40a, 44a, 50a, and 54a, and the parallelism of the radiating surfaces are difficult to ensure.

In contrast, in this example embodiment, at least one of the first rib 48 and the second rib 58 is provided across the entire length in the X direction of the first region 71. Therefore, the rigidity of the structure is able to be increased in the direction in which the sealing resin body 70 is held down. As a result, the structure will not deform as easily in the Z direction compared to the related art, so in the cutting process, deformation in the Z direction is able to be inhibited in the first region 71, and thus the semiconductor device 100. Consequently, the flatness of the radiating surfaces 40a, 44a, 50a, and 54a and the parallelism of the radiating surfaces are able to be ensured, so the heat dissipation properties to the cooler is able to be improved.

According to this structure, deformation in the Z direction is able to be inhibited from occurring in the first region 71, and thus the semiconductor device 100, not only in the cutting process, but also after the sealing resin body 70 is formed. For example, deformation in the Z direction is able to be inhibited from occurring in the first region 71, and thus semiconductor device 100, when the semiconductor device 100 is transported while the sealing resin body 70 is being pressed on from both sides in the X direction. As a result, the reliability of the connection of the connecting portion by the solder 60, for example, is able to be improved.

Also, in this example embodiment, the first rib 48 is provided locally on the first base portion 47 that is thinner than the second heat sink 44, and the second rib 58 is provided locally on the second base portion 57 that is thinner than the third heat sink 50. Therefore, the first link portion 46 and the second link portion 56 are able to be bent. That is, the second heat sink 44 and the third heat sink 50 that are arranged in different positions in the Z direction are able to be electrically connected by bending at least one of the first link portion 46 and the second link portion 56.

Further, the first link portion 46 is provided on the second heat sink 44, and the second link portion 56 is provided on the third heat sink 50, and the first link portion 46 and the second link portion 56 are connected together by the solder 60. Accordingly, there is a portion where the first link portion 46 and the second link portion 56 are connected together via the solder 60, i.e., a thick portion in the Z direction, in the first region 71. Therefore, the rigidity of the structure described above is able to be increased, so deformation in the Z direction is able to be effectively inhibited from occurring in the first region 71.

Figure 10:
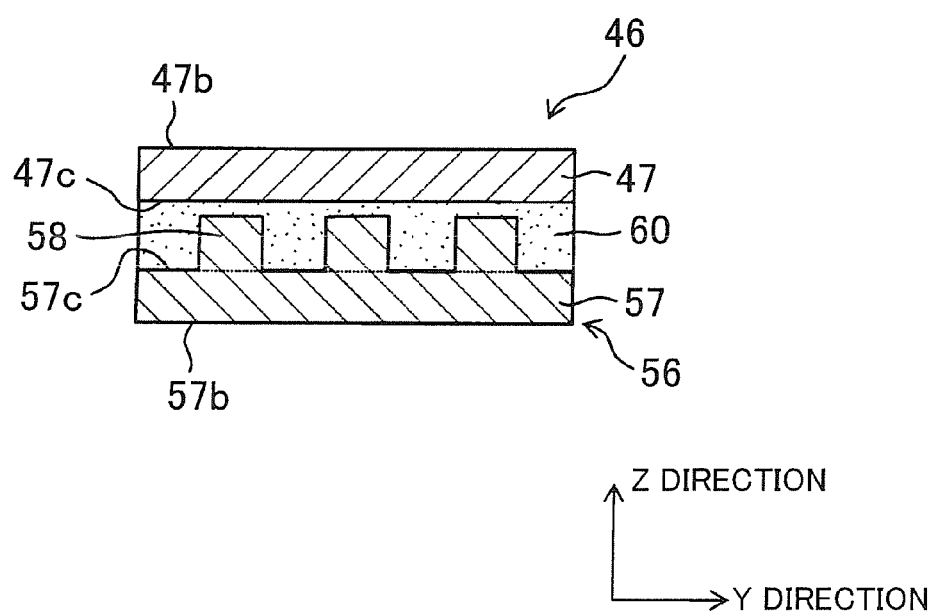
FIG. 10 is a sectional view corresponding to FIG. 7, of a first modified example.

Moreover, in this example embodiment, the first rib 48 protrudes from the outside surface 47b of the first base portion 47, and the second rib 58 protrudes from the outside surface 57b of the second base portion 57. The ribs 48 and 58 are provided to increase the rigidity, and the protruding height (thickness) is set to be longer than the thickness of the corresponding first base portion 47 and second base portion 57, for example. However, in this example embodiment, the ribs 48 and 58 are not provided on the first connecting surface 47c and the second connecting surface 57c, so the heights of the ribs 48 and 58 will not affect the connection with the solder 60. Therefore, the connection area with the solder 60 is able to be ensured while increasing the rigidity. However, if the solder 60 is unable to be divided by the ribs 48 and 58, then the rib 48 and 58 may be provided on at least one of the first connecting surface 47c and the second connecting surface 57c. In a first modified example shown in FIG. 10, the second rib 58 is provided on the second connecting surface 57c.

Also, in this example embodiment, the inside surface 47a of the first base portion 47 is continuously connected in a stepless manner to the inside surface 44b of the second heat sink 44, and the thickness of the portion of the first link portion 46 where the first rib 48 is provided is thinner than the second heat sink 44. Also, the inside surface 57a of the second base portion 57 is continuously connected in a stepless manner to the inside surface 50b of the third heat sink 50, and the thickness of the portion of the second link portion 56 where the second rib 58 is provided is thinner than the third heat sink 50. Therefore, the first link portion 46 may be arranged farther toward the first heat sink 40 side than the radiating surface 44a, and the second link portion 56 is arranged farther toward the fourth heat sink 54 side than the radiating surface 50a. That is, as shown in FIG. 6, the first link portion 46 and the second link portion 56 are not easily exposed from the sealing resin body 70. For example, as illustrated in this example embodiment, the portion of the first link portion 46 where the inside surface 47a is flush with the inside surface 44b, and the portion of the second link portion 56 where the inside surface 57a is flush with the inside surface 54b are not exposed from the first surface 70a and the second surface 70b of the sealing resin body 70. Therefore, creeping distance is able to be obtained. For example, when the first rib 48 is exposed on the second surface 70b, creeping distance must be ensured between the first rib 48 and the fourth heat sink 54 in the X direction, but in this example embodiment, creeping distance need only be ensured between the second heat sink 44 and the fourth heat sink 54 in the X direction. Therefore, the physical size of the semiconductor device 100 is able to be made smaller.

Also, the thickness of the portion where the first rib 48 is provided, i.e., the thickness of the entire region of the first link portion 46, is thinner than the second heat sink 44, and the thickness of the portion where the second rib 58 is provided, i.e., the thickness of the entire region of the second link portion 56, is thinner than the third heat sink 50, so the first link portion 46 and the second link portion 56 are able to be bent easily.

In this example embodiment, the first rib 48 and the second rib 58 are arranged in a seamless manner along the entire length in the X direction of the first region 71. Also, an example is described in which the end portion of the first rib 48 that is on the opposite side of the first rib 48 from the second heat sink 44, and the end portion of the second rib 58 that is on the opposite side of the second rib 58 from the third heat sink 50, are aligned in the X direction, and only the second rib 58 is provided on the connecting portion where the first connecting surface 47c and the second connecting surface 57c are connected via the solder 60. However, a structure in which only the first rib 48 is provided on the connecting portion where the first connecting surface 47c and the second connecting surface 57c are connected via the solder 60, while being arranged in a seamless manner, is also possible.

Also, in this example embodiment, an example is described in which three of the first ribs 48 are provided on the first base portion 47, and three of the second ribs 58 are provided on the second base portion 57. However, the number of the ribs 48 and 58 is not particularly limited.

SECOND EXAMPLE EMBODIMENT

In this example embodiment, descriptions of portions common to the semiconductor device 100 described in the example embodiment above will be omitted.

Figure 11:
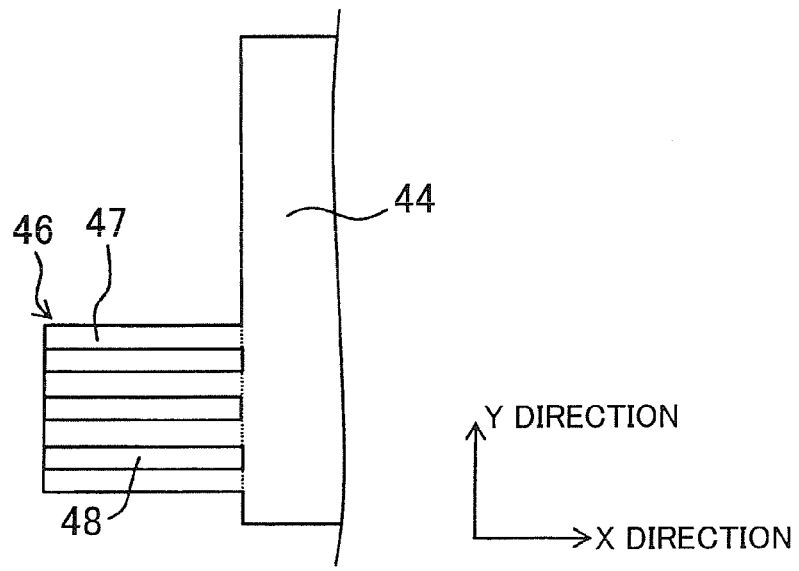
FIG. 11 is an enlarged plan view corresponding to FIG. 4A, of the area around a first link portion in a semiconductor device according to a second example embodiment of the invention.
Figure 12:
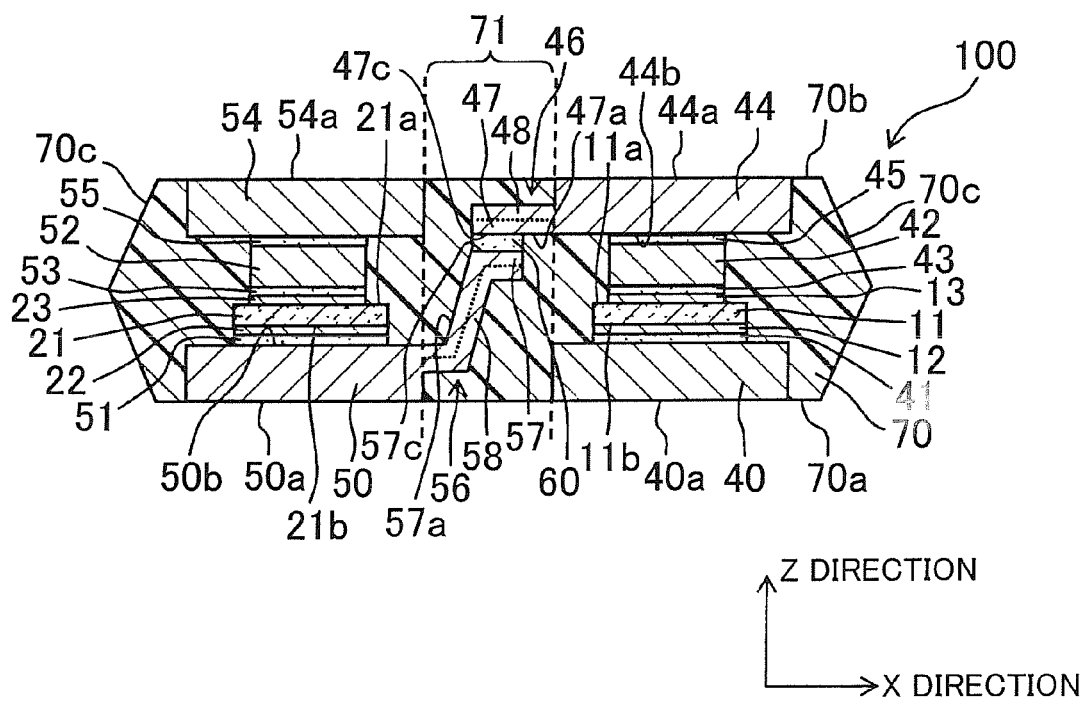
FIG. 12 is a sectional view corresponding to FIG. 6, of the semiconductor device according to the second example embodiment.

In this example embodiment, as shown in FIGS. 11 and 12, in addition to the structure described above in the first example embodiment, the first rib 48 is provided extending from the boundary of the first base portion 47 with the second heat sink 44 to the tip end of the first base portion 47 opposite the boundary, in the X direction. This example embodiment is characteristic in that the first rib 48 and the second rib 58 are both provided on the connecting portion where the first connecting surface 47c and the second connecting surface 57c are connected via the solder 60. All other points are the same as in the first example embodiment.

When the ribs 48 and 58 are provided from the boundaries with the corresponding heat sinks 44 and 50 to the tip ends in this way, the rigidity of the structure described above is able to be further increased. That is, when the sealing resin body 70 is pressed from both sides in the X direction, deformation is able to be more effectively inhibited from occurring in the first region 71, and thus in the semiconductor device 100. For example, in the cutting process, deformation in the Z direction is able to be inhibited from occurring in the first region 71, and thus in the semiconductor device 100, so the flatness of the radiating surfaces 40a, 44a, 50a, and 54a, and the parallelism of the radiating surfaces, are able to be ensured. Also, the rigidity of the connecting portion by the solder 60 is able to be particularly increased, so deformation of the connecting portion is able to be inhibited, and the reliability of the connection by the solder 60 is also able to be improved.

In this example embodiment, an example is described in which three of the first ribs 48 are provided on the first base portion 47, and three of the second ribs 58 are provided in the second base portion 57. However, the number of the ribs 48 and 58 is not particularly limited.

THIRD EXAMPLE EMBODIMENT

In this example embodiment, descriptions of portions common to the semiconductor device 100 described in the example embodiment above will be omitted.

Figure 13:
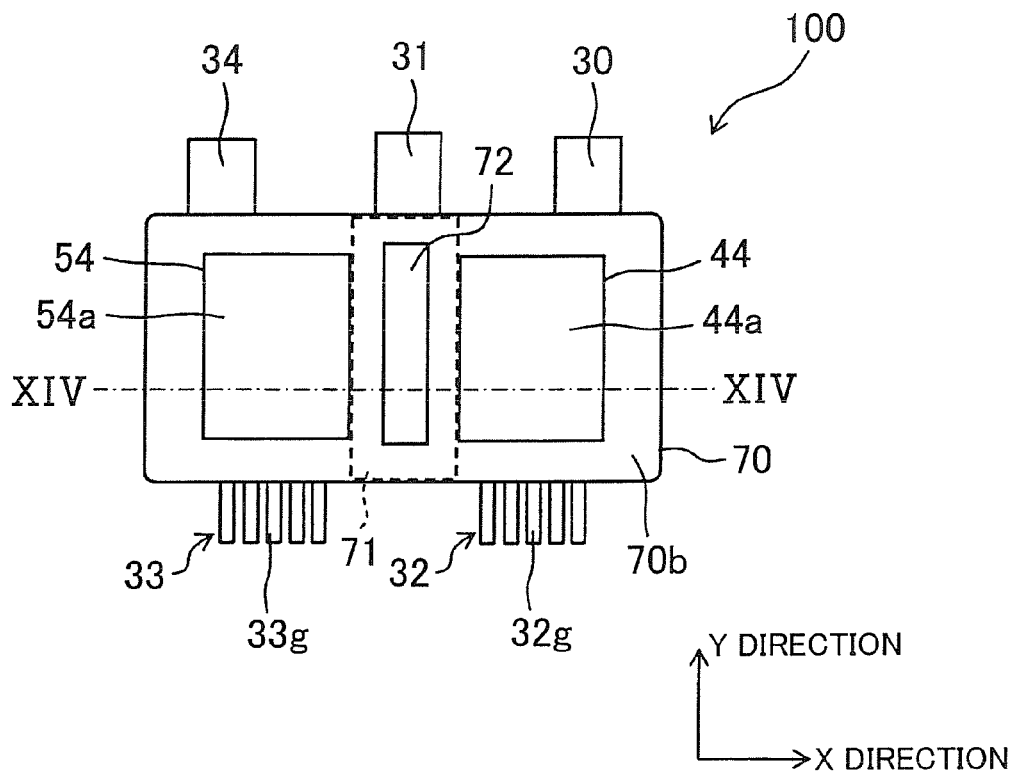
FIG. 13 is a plan view corresponding to FIG. 2, showing the general structure of a semiconductor device according to a third example embodiment of the invention.
Figure 14:
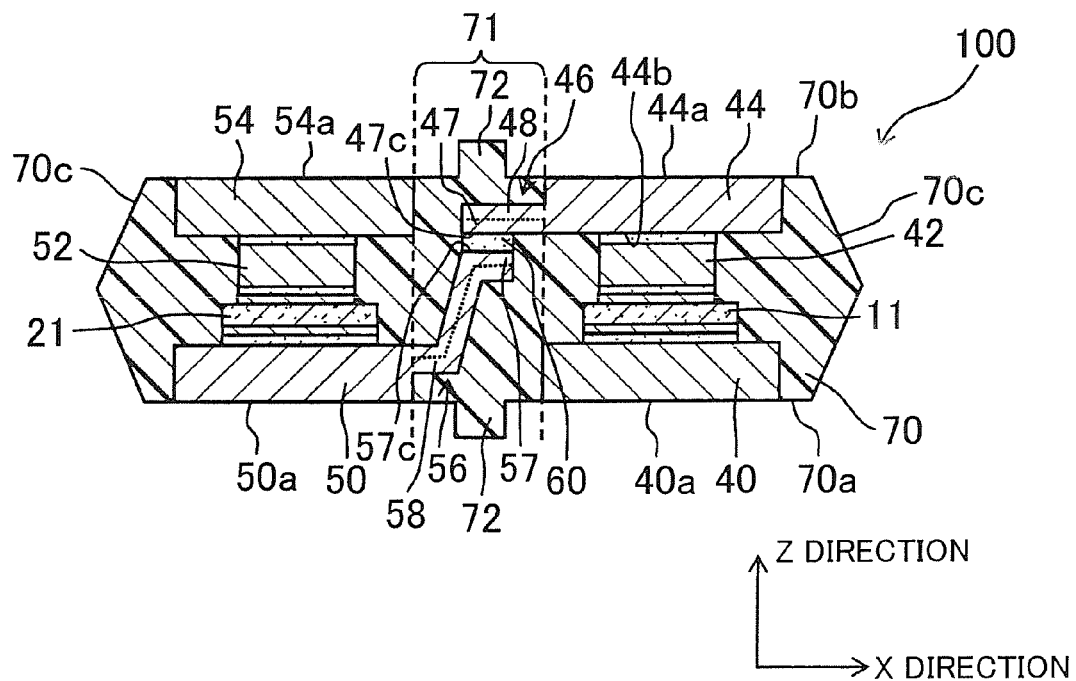
FIG. 14 is a sectional view taken along line XIV-XIV in FIG. 13.

This example embodiment is characteristic in that, in addition to the structure described above in the second example embodiment, a protruding portion 72 is provided on at least one of the first surface 70a and the second surface 70b of the sealing resin body 70, in the first region 71, as shown in FIGS. 13 and 14.

In the example shown in FIGS. 13 and 14, the protruding portion 72 is provided on a portion of the first surface 70a in the first region 71 in the X direction. Also, the protruding portion 72 is provided on a portion of the second surface 70b in the first region 71 in the X direction. More specifically, the protruding portion 72 is provided on portions of the first surface 70a and the second surface 70b, which are directly above the connecting portion where the first connecting surface 47c and the second connecting surface 57c are connected by the solder 60. Also, the protruding portion 72 is provided extending across the region where the heat sinks 40, 44, 50, and 54 are arranged, in the Y direction. This kind of protruding portion 72 may be formed by leaving the sealing resin body 70 locally in the cutting process, for example.

When the protruding portion 72 is provided on the sealing resin body 70 in the first region 71 in this way, the sealing resin body 70 becomes thicker by the amount of the protruding portion 72, so the rigidity of the first region 71 is increased. Therefore, deformation is able to be more effectively inhibited from occurring in the first region 71, and thus in the semiconductor device 100, when the sealing resin body 70 is pressed from both sides in the X direction.

The arrangement of the protruding portion 72 is not limited to the example described above as long as the protruding portion 72 is provided on at least one of the first surface 70a and the second surface 70b, in the first region 71. Also, the number of protruding portions 72 provided on the first surface 70a, and the number of protruding portions 72 provided on the second surface 70b are not particularly limited.

Also, in this example embodiment, an example is described in which the protruding portion 72 is combined with the structure illustrated in the second example embodiment, but the protruding portion 72 may also be combined with the structure illustrated in the first example embodiment.

FOURTH EXAMPLE EMBODIMENT

In this example embodiment, descriptions of portions common to the semiconductor device 100 described in the example embodiment above will be omitted.

Figure 15:
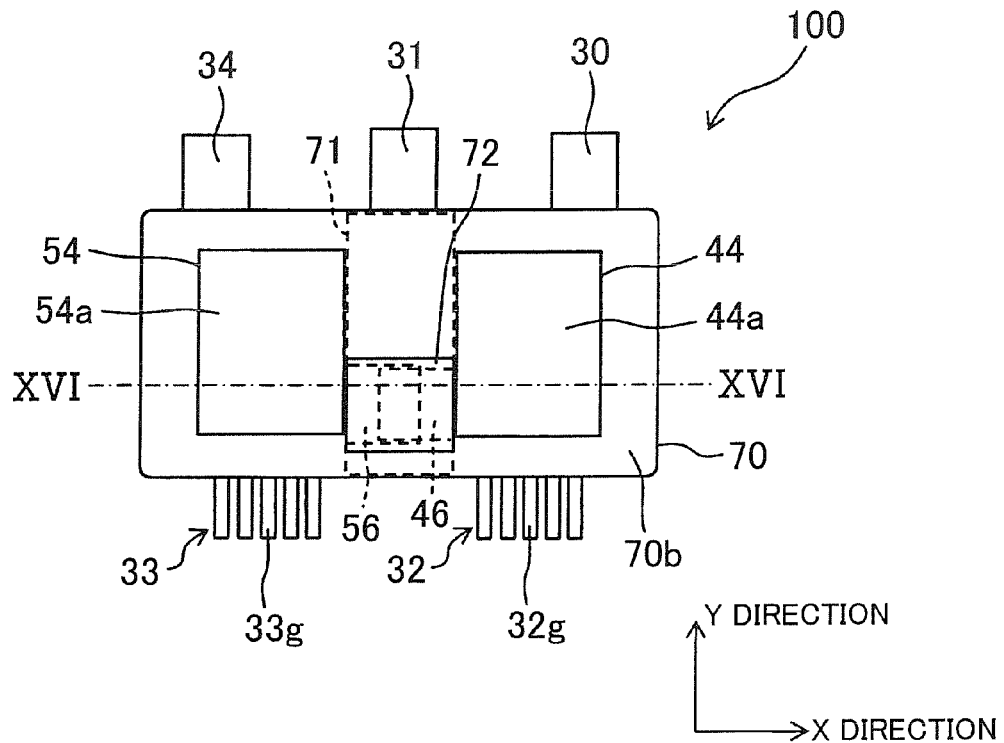
FIG. 15 is a plan view corresponding to FIG. 2, showing the general structure of a semiconductor device according to a fourth example embodiment of the invention.
Figure 16:
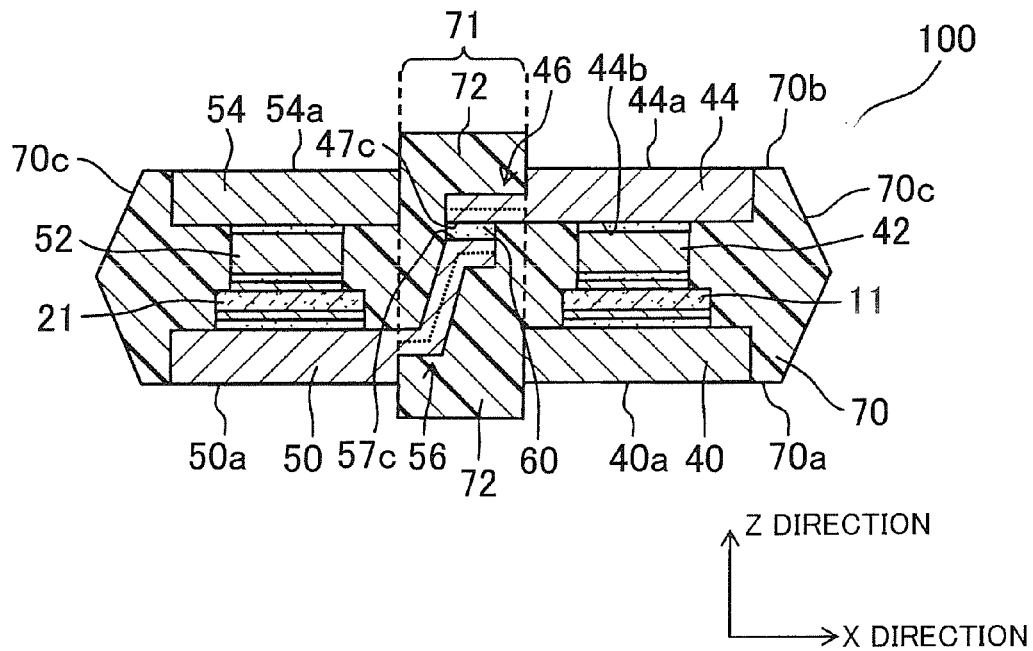
FIG. 16 is a sectional view taken along line XVI-XVI in FIG. 15.

This example embodiment is characteristic in that, in addition to the structure described above in the third example embodiment, a protruding portion 72 is provided covering the first link portion 46 and the second base portion 57, on a plane defined by the X direction and the Y direction, as shown in FIGS. 15 and 16.

In the example shown in FIGS. 15 and 16, the protruding portion 72 of the second surface 70b is provided extending from one end to the other end of the first region 71 in the X direction, while having a predetermined height in the Y direction, in the first region 71, so as to cover the first link portion 46 and the second link portion 56. Similarly, the protruding portion 72 of the first surface 70a is also provided extending from one end to the other end of the first region 71 in the X direction, while having a predetermined height in the Y direction, in the first region 71, so as to cover the first link portion 46 and the second link portion 56.

When the protruding portion 72 that covers the first link portion 46 and the second link portion 56 is employed in this way, the rigidity with respect to compression in the X direction is increased because the protruding portion 72 is present across the entire length in the X direction of the first region 71, so deformation of the first region 71 is able to be even more effectively inhibited. In particular, the sealing resin body 70 directly above the first link portion 46 and the second link portion 56 becomes thicker, so deformation of the structure of the first link portion 46 and the second link portion 56 is able to be even more effectively inhibited.

Also, because the protruding portion 72 is provided covering the first link portion 46 and the second link portion 56, the first link portion 46 and the second link portion 56 will not easily be exposed from the sealing resin body 70 even if the thickness of the first link portion 46 at the portion where the first rib 48 is provided is substantially equal to that of the second heat sink 44, and the thickness of the second link portion 56 at the portion where the second rib 58 is provided is substantially equal to that of the third heat sink 50. As a result, creeping distance is able to be obtained, and the physical size of the semiconductor device 100 is able to be made smaller.

FIFTH EXAMPLE EMBODIMENT

In this example embodiment, descriptions of portions common to the semiconductor device 100 described in the example embodiment above will be omitted.

Figure 17:
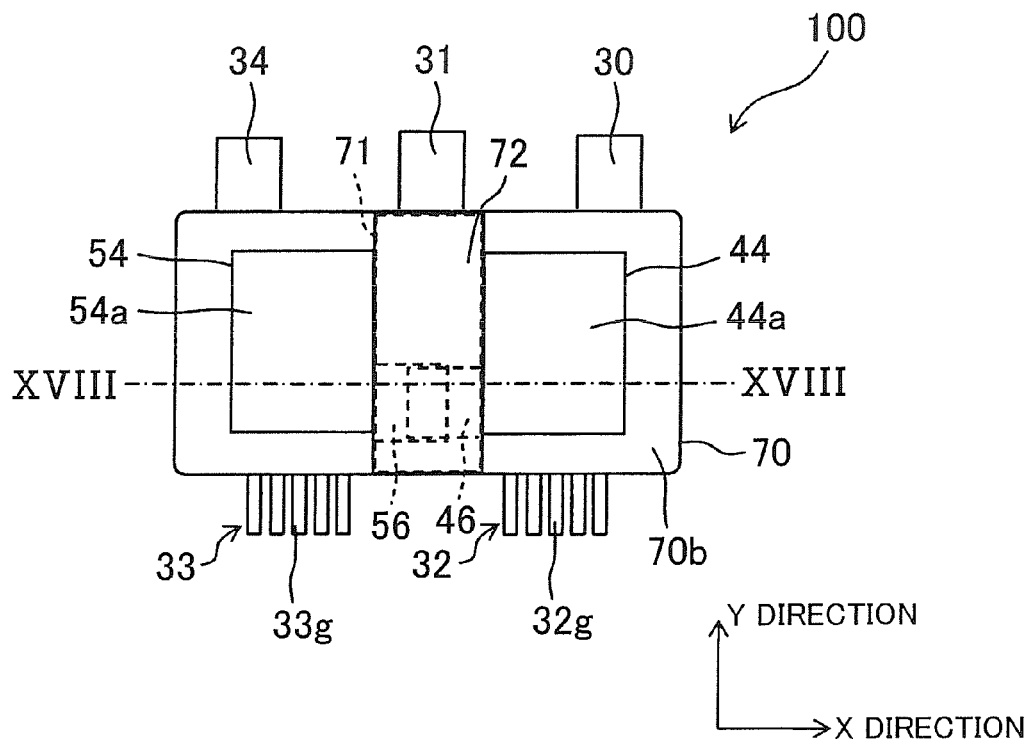
FIG. 17 is a plan view corresponding to FIG. 2, showing the general structure of a semiconductor device according to a fifth example embodiment of the invention.

This example embodiment is characteristic in that, in addition to the structure described above in the fourth example embodiment, a protruding portion 72 is provided covering the entire first region 71, as shown in FIG. 17.

In the example shown in FIG. 17, the protruding portion 72 is provided over the entire first region 71 on the second surface 70b of the sealing resin body 70. The protruding portion 72 is also provided over the entire first region 71 on the first surface 70a of the sealing resin body 70. This protruding portion 72 has a flat rectangular shape, as shown in FIG. 17.

When the protruding portion 72 is provided over the entire first region 71, the rigidity of the entire first region 71 is able to be increased, so deformation of the first region 71 is able to be more effectively inhibited.

Figure 18:
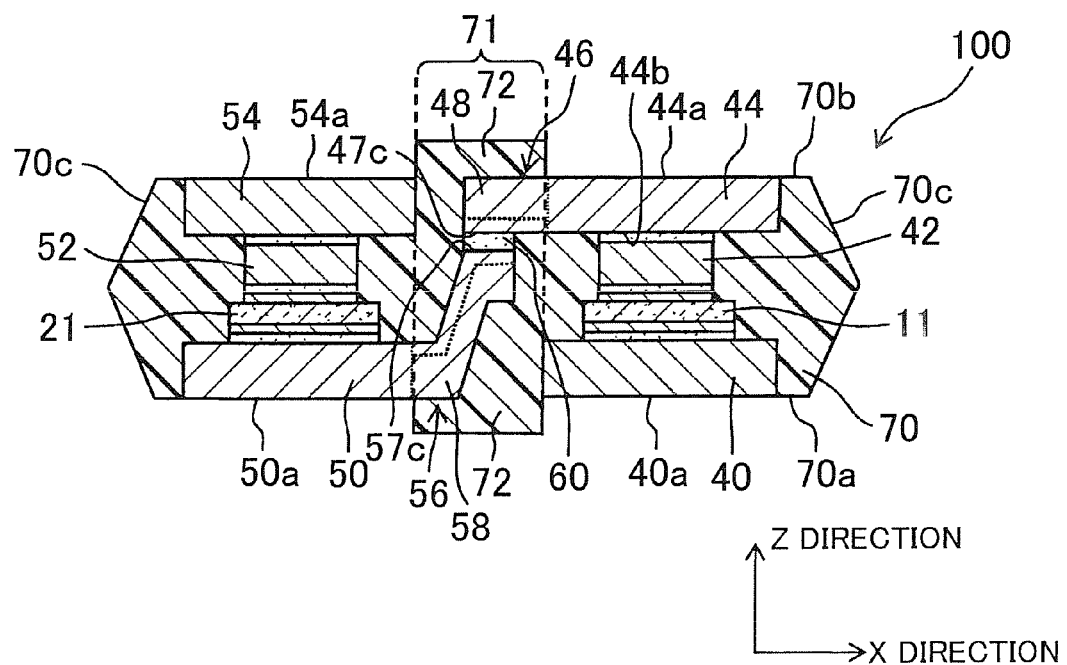
FIG. 18 is a sectional view corresponding to FIG. 6, of a second modified example.

Also, in FIG. 18, the protruding portion 72 is able to be provided by cutting in the Y direction, so the protruding portion 72 is able to be easily formed by cutting.

The protruding portion 72 described above may also be provided on only one of the first surface 70a and the second surface 70b.

While preferred example embodiments of the invention have been described, the invention is not at all limited to these example embodiments, but may be carried out in any of a variety of modes without departing from the scope thereof.

In the example embodiments described above, a case of a 2 in 1 package in which the semiconductor device 100 includes a pair of circuit portions, i.e., the upper arm circuit portion 10 and the lower arm circuit portion 20, is described. However, the semiconductor device 100 may also include a plurality of pairs of the upper arm circuit portion 10 and the lower arm circuit portion 20. For example, the invention may also be applied to a 6 in 1 package in which the semiconductor device 100 includes three pairs of upper arm circuit portions 10 and lower arm circuit portions 20.

In the example described above, the FWD elements 15 and 25 are formed on a separate chip from the IGBT elements 11 and 21. However, a so-called RC-IGBT chip in which the IGBT elements and the FWD elements are formed on the same chip may also be employed.

In this example embodiments described above, bending is performed only on the second link portion 56, from among the first link portion 46 and the second link portion 56, but bending may also be performed only on the first link portion 46. Also, bending may be performed on both the first link portion 46 and the second link portion 56.

In the example embodiments described above, the thickness of the portion of the first link portion 46 where the first rib 48 is provided, i.e., the thickness of the entire region of the first link portion 46, is thinner than the thickness of the second heat sink 44, and the thickness of the portion of the second link portion 56 where the second rib 58 is provided, i.e., the thickness of the entire region of the second link portion 56, is thinner than the thickness of the third heat sink 50. However, the thickness of the portion where the first rib 48 is provided may be the same as the thickness of the second heat sink 44, and the thickness of the portion where the second rib 58 is provided may be the same as the thickness of the third heat sink 50. In this case, as shown in the modified example shown in FIG. 18, providing the protruding portion 72 on the sealing resin body 70 enables the first link portion 46 and the second link portion 56 to not to be exposed from the sealing resin body 70. That is, creeping distances is able to be obtained, and the physical size of the semiconductor device 100 is able to be made smaller.

In the example embodiments described above, the semiconductor device 100 is provided with the first terminal 42 and the second terminal 52. However, the semiconductor device 100 may also be configured without the first terminal 42 and the second terminal 52. That is, the IGBT element 11 and the FWD element 15 may be electrically and mechanically connected to the first terminal 42, and the IGBT element 21 and the FWD element 25 may be electrically and mechanically connected to the second terminal 52.

Figure 19:
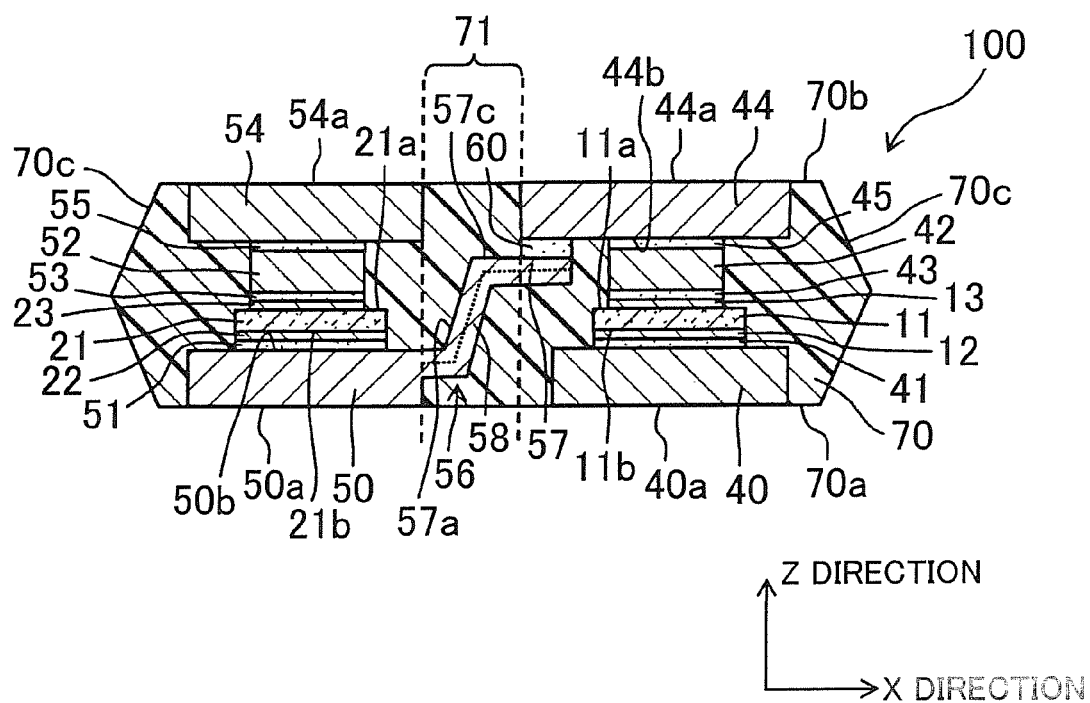
FIG. 19 is a sectional view corresponding to FIG. 6, of a third modified example.

In the example embodiments described above, the first link portion 46 is provided extending in the X direction from the second heat sink 44, and the second link portion 56 is provided extending in the X direction from the third heat sink 50. That is, a link portion is provided on both the second heat sink 44 and the third heat sink 50. However, a link portion need only be provided on at least one of the second heat sink 44 and the third heat sink 50. Therefore, the second heat sink 44 and the third heat sink 50 may also be electrically connected by the link portion provided on only one of the second heat sink 44 and the third heat sink 50. For example, in a third modified example shown in FIG. 19, only the third heat sink 50 is provided with a link portion (the second link portion 56) having a rib (the second rib 58). Also, the second link portion 56 and the second rib 58 are provided extending to a position overlapping with the second heat sink 44 in the X direction, and are electrically and mechanically connected to the second heat sink 44 via the solder 60. The second rib 58 need only be provided across the entire length in the X direction of the first region 71, and thus does not have to be provided extending to a position overlapping with the second heat sink 44. Also, the second heat sink 44 may have a recessed portion at the connecting location of the solder 60, and the solder 60 may be arranged in this recessed portion. Also, the structure may also be such that only the second heat sink 44 is provided with a link portion (the first link portion 46) having a rib (the first rib 48).

In the example embodiments described above, the heat sinks 40, 44, 50, and 54 are cut together with the sealing resin body 70, such that the radiating surfaces 40a and 50a are exposed from the first surface 70a, and the radiating surfaces 44a and 54a are exposed from the second surface 70b. However, the radiating surfaces 40a, 44a, 50a, and 54a may also be exposed without cutting. In this case as well, deformation in the Z direction is able to be inhibited from occurring in the first region 71, and thus the semiconductor device 100, while the sealing resin body 70 is being pressed from both sides in the X direction.

In the example embodiments described above, the radiating surfaces 40a and 50a of the first heat sink 40 and the third heat sink 50 are exposed from the first surface 70a of the sealing resin body 70, and the radiating surfaces 44a and 54a of the second heat sink 44 and the fourth heat sink 54 are exposed from the second surface 70b. However, the structure may also be such that the second heat sink 44 and the fourth heat sink 54 are covered by the sealing resin body 70, and only the radiating surfaces 40a and 50a are exposed.

What is claimed is:

1. A semiconductor device comprising:
   a first semiconductor element that forms an upper arm and has an electrode on each of a first surface and a first back surface that is on an opposite side of the first semiconductor element from the first surface;

a second semiconductor element that forms a lower arm and is arranged parallel to the first semiconductor element, and has an electrode on each of a second surface and a second back surface that is on an opposite side of the second semiconductor element from the second surface;

a first heat sink that is electrically connected to the electrode on the first back surface of the first semiconductor element;

a second heat sink that is electrically connected to the electrode on the first surface of the first semiconductor element;

a third heat sink that is electrically connected to the electrode on the second back surface of the second semiconductor element;

a fourth heat sink that is electrically connected to the electrode on the second surface of the second semiconductor element;

a link portion that is provided on at least one of the second heat sink and the third heat sink, and has a base portion that is thinner than the corresponding heat sink, and that electrically connects the second heat sink to the third heat sink via a solder; and a sealing resin body that integrally seals the first semiconductor element, the second semiconductor element, the first heat sink, the second heat sink, the third heat sink, the fourth heat sink, and the link portion, wherein the solder is arranged on a connecting surface of the base portion, which is orthogonal to a plate thickness direction of the base portion itself, in a direction perpendicular to the first surface and the second surface;

a radiating surface of each of the first heat sink and the third heat sink, which is on an opposite side of the first heat sink and the third heat sink from the corresponding semiconductor element, is exposed from the sealing resin body; and the link portion has a rib that protrudes from the base portion in a direction perpendicular to the first surface and the second surface; a thickness of a portion where the rib is provided is equal to or less than the thickness of the corresponding heat sink; and when a region that is sealed by the sealing resin body and that is between the second heat sink and the third heat sink in an alignment direction of the first heat sink and the third heat sink is a first region, the rib is provided across an entire length of the first region in the alignment direction.

2. The semiconductor device according to claim 1, wherein a radiating surface of each of the second heat sink and the fourth heat sink, which is on an opposite side of the second heat sink and the fourth heat sink from the corresponding semiconductor element, is exposed from the sealing resin body.

3. The semiconductor device according to claim 2, wherein the link portion includes a first link portion integrally provided with the second heat sink, and a second link portion integrally provided with the third heat sink;

the base portion includes a first base portion that is provided on the first link portion and is thinner than the second heat sink, and a second base portion that is provided on the second link portion and is thinner than the third heat sink;

a first connecting surface of the first base portion, which is orthogonal to a plate thickness direction of the first base portion itself, is connected, via the solder in the direction perpendicular to the first surface and the second surface, to a second connecting surface of the second base portion, which is orthogonal to a plate thickness direction of the second base portion itself;

the first link portion has a first rib that protrudes from at least one of an inside surface, that includes the first connecting surface of the first base portion, and an outside surface of the first base portion, which is on an opposite side of the first base portion from the inside surface, and a thickness of a portion where the first rib is provided is equal to or less than the thickness of the second heat sink; and the second link portion has a second rib that protrudes from at least one of an inside surface, that includes the second connecting surface, of the second base portion, and an outside surface of the second base portion, which is on an opposite side of the second base portion from the inside surface, and a thickness of a portion where the second rib is provided is equal to or less than the thickness of the third heat sink.

4. The semiconductor device according to claim 3, wherein the first rib is provided extending from a boundary between the first base portion and the second heat sink to a tip end of the first base portion opposite the boundary, in the alignment direction; and the second rib is provided extending from a boundary between the second base portion and the third heat sink to a tip end of the second base portion opposite the boundary, in the alignment direction.

5. The semiconductor device according to claim 3, wherein the first rib protrudes from the outside surface of the first base portion; and the second rib protrudes from the outside surface of the second base portion.

6. The semiconductor device according to claim 5, wherein the inside surface of the first base portion is continuously connected in a stepless manner to a surface on the first semiconductor element side of the second heat sink;

a thickness of a portion of the first link portion where the first rib is provided is thinner than the second heat sink, and the inside surface of the second base portion is continuously connected in a stepless manner to a surface of the third heat sink that opposes the second semiconductor element; and a thickness of a portion of the second link portion where the second rib is provided is thinner than the third heat sink.

7. The semiconductor device according to claim 3, wherein a protruding portion is provided on at least one of i) a first surface of the sealing resin body, where the radiating surfaces of the first heat sink and the third heat sink are exposed, and ii) a second surface of the sealing resin body, where the radiating surfaces of the second heat sink and the fourth heat sink are exposed.

8. The semiconductor device according to claim 7, wherein the protruding portion is provided covering the first link portion and the second link portion in a direction along the first surface and the second surface.

9. The semiconductor device according to claim 8, wherein the protruding portion is provided over the entire first region.

10. A manufacturing method of the semiconductor device according to claim 2, comprising:

preparing, for at least one of a second heat sink and a third heat sink, a heat sink that has the link portion that electrically connects the second heat sink to the third heat sink via the solder, the link portion having a base portion that is thinner than the corresponding heat sink, and the rib that protrudes from the base portion in the direction perpendicular to the first surface and the second surface, and that is provided across the entire length in the alignment direction of the first region in which the position in the alignment direction of the first heat sink and the third heat sink is between the second heat sink and the third heat sink, and the thickness of the portion of the link portion where the rib is provided being equal to or less than the thickness of the corresponding heat sink;

electrically connecting the electrode on the first back surface of the first semiconductor element to the first heat sink, electrically connecting the electrode on the first surface of the first semiconductor element to the second heat sink, electrically connecting the electrode on the second back surface of the second semiconductor element to the third heat sink, electrically connecting the electrode on the second surface of the semiconductor element to the fourth heat sink, and electrically connecting the second heat sink to the third heat sink via the solder by the link portion;

forming the sealing resin body so as to integrally seal the first semiconductor element, the second semiconductor element, the first heat sink, the second heat sink, the third heat sink, the fourth heat sink, and the link portion, and such that the radiating surface of each of the heat sinks is covered; and exposing the radiating surfaces of the first heat sink and the third heat sink from the sealing resin body by cutting the first heat sink and the third heat sink together with the sealing resin body, and exposing the radiating surfaces of the second heat sink and the fourth heat sink from the sealing resin body by cutting the second heat sink and the fourth heat sink together with the sealing resin body, while the sealing resin body is being pressed on from both sides in the alignment direction of the first heat sink and the third heat sink.

* * * * *